(12) United States Patent  
Ohsawa et al.

(10) Patent No.: US 8,808,562 B2
(45) Date of Patent: Aug. 19, 2014

(54) DRY METAL ETCHING METHOD

(75) Inventors: Yusuke Ohsawa, Albany, NY (US); Hiroto Ohtake, Tokyo (JP); Eiji Suzuki, Tokyo (JP); Kaushik Arun Kumar, Poughkeepsie, NY (US); Andrew W. Metz, Loundonville, NY (US)

(73) Assignee: Tokyo Electron Limited, Tokyo (JP)

( * ) Notice: Subject to any disclaimer, the term of this patent is extended or adjusted under 35 U.S.C. 154(b) by 401 days.

(21) Appl. No.: 13/230,721

(22) Filed: Sep. 12, 2011

(65) Prior Publication Data

US 2013/0065398 A1 Mar. 14, 2013

(51) Int. Cl.
 *B44C 1/22* (2006.01)
 *H01J 37/32* (2006.01)
 *H01L 21/3213* (2006.01)
(52) U.S. Cl.
 CPC ..... *H01L 21/32136* (2013.01); *H01J 37/32238* (2013.01); *H01J 37/3222* (2013.01); *H01J 37/32247* (2013.01)
 USPC ............... 216/77; 216/58; 216/67; 438/706; 438/710; 438/726
(58) Field of Classification Search
 None
 See application file for complete search history.

(56) References Cited

U.S. PATENT DOCUMENTS

| | | | |
|---|---|---|---|
| 4,460,413 A * | 7/1984 | Hirata et al. | 438/297 |
| 5,024,716 A | 6/1991 | Sato | |
| 5,994,235 A | 11/1999 | O'Donnell | |
| 6,242,107 B1 | 6/2001 | O'Donnell | |
| 7,186,659 B2 | 3/2007 | Fujimoto | |
| 7,709,397 B2 | 5/2010 | Chen et al. | |
| 7,964,512 B2 | 6/2011 | Wang et al. | |
| 2003/0068846 A1 * | 4/2003 | Moise et al. | 438/200 |
| 2006/0086692 A1 * | 4/2006 | Fujimoto et al. | 216/67 |
| 2009/0311870 A1 | 12/2009 | Sasaki | |
| 2009/0314635 A1 * | 12/2009 | Moyama et al. | 204/192.32 |

* cited by examiner

*Primary Examiner* — Lan Vinh
*Assistant Examiner* — Jiong-Ping Lu
(74) *Attorney, Agent, or Firm* — Wood, Herron & Evans, LLP

(57) ABSTRACT

A method of etching an aluminum-containing layer on a substrate is described. The method includes forming plasma from a process composition containing a halogen element, and exposing the substrate to the plasma to etch the aluminum-containing layer. The method may additionally include exposing the substrate to an oxygen-containing environment to oxidize a surface of the aluminum-containing layer and control an etch rate of the aluminum-containing layer. The method may further include forming first plasma from a process composition containing HBr and an additive gas having the chemical formula $C_xH_yR_z$ (wherein R is a halogen element, x and y are equal to unity or greater, and z is equal to zero or greater), forming second plasma from a process composition containing HBr, and exposing the substrate to the first plasma and the second plasma to etch the aluminum-containing layer.

15 Claims, 17 Drawing Sheets

DRY METAL ETCHING METHOD

BACKGROUND OF THE INVENTION

1. Field of Invention

The invention relates to a method for etching a metal-containing layer on a substrate.

2. Description of Related Art

In semiconductor manufacturing, metal-containing materials are common place and pose formidable challenges to process integration. In particular, improved metal etch processes are required.

SUMMARY OF THE INVENTION

Embodiments of the invention relate to a method for etching a metal-containing layer on a substrate. Additional embodiments of the invention relate to a method for etching an aluminum-containing layer, such as aluminum, aluminum alloy, or aluminum oxide ($AlO_x$) on a substrate.

According to one embodiment, a method for etching a metal-containing layer on a substrate is described. The method includes disposing a substrate having an aluminum-containing layer formed thereon in a plasma processing system, forming plasma from a process composition containing a halogen element, and exposing the substrate to the plasma to etch the aluminum-containing layer. The method additionally includes exposing the substrate to an oxygen-containing environment to oxidize a surface of the aluminum-containing layer and control an etch rate of the aluminum-containing layer.

According to another embodiment, a method for etching a metal-containing layer on a substrate is described. The method includes disposing a substrate having an aluminum-containing layer formed thereon in a plasma processing system, forming first plasma from a process composition containing HBr and an additive gas having the chemical formula $C_xH_yR_z$ (wherein R is a halogen element, x and y are equal to unity or greater, and z is equal to zero or greater), and exposing the substrate to the first plasma to etch the aluminum-containing layer. The method further includes forming second plasma from a process composition containing HBr, and exposing the substrate to the second plasma to etch the aluminum-containing layer.

According to yet another embodiment, a method for etching a metal-containing layer on a substrate is described. The method includes disposing a substrate having an aluminum-containing layer formed thereon in a plasma processing system, forming plasma from a process composition containing a halogen element, applying an electrical bias to the substrate by coupling radio frequency (RF) power to a substrate holder upon which the substrate rests, and exposing the substrate to the plasma to etch the aluminum-containing layer. The method additionally includes achieving a target etch selectivity between the aluminum-containing layer and a layer containing Si and O formed on the substrate by adjusting an RF power level for the electrical bias.

DETAILED DESCRIPTION OF SEVERAL EMBODIMENTS

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

Figure 1A:
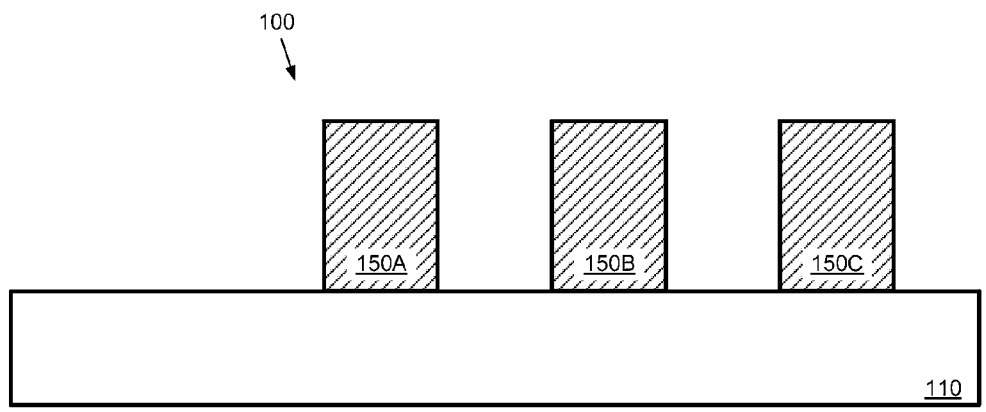
FIGS. 1A through 1C illustrate a schematic representation of various methods for preparing a device structure on a substrate.

As noted above in semiconductor manufacturing, metal etching continues to pose formidable challenges for process integration. As an example, FIG. 1A provides a pictorial illustration of a first metal-containing layer patterning scheme. Therein, a plurality of device structures 100 are formed on a substrate 110 by patterning a device stack that includes a metal-containing layer (150A, 150B, 150C). The metal-containing layer (150A, 150B, 150C) may include a metal, a metal alloy, a metal oxide, a metal nitride, or a metal silicate. Accordingly, there exists the need to pattern etch the metal-containing layer (150A, 150B, 150C) while achieving acceptable profile control and etch selectivity between the metal-containing layer and other materials on the substrate.

Figure 1B:
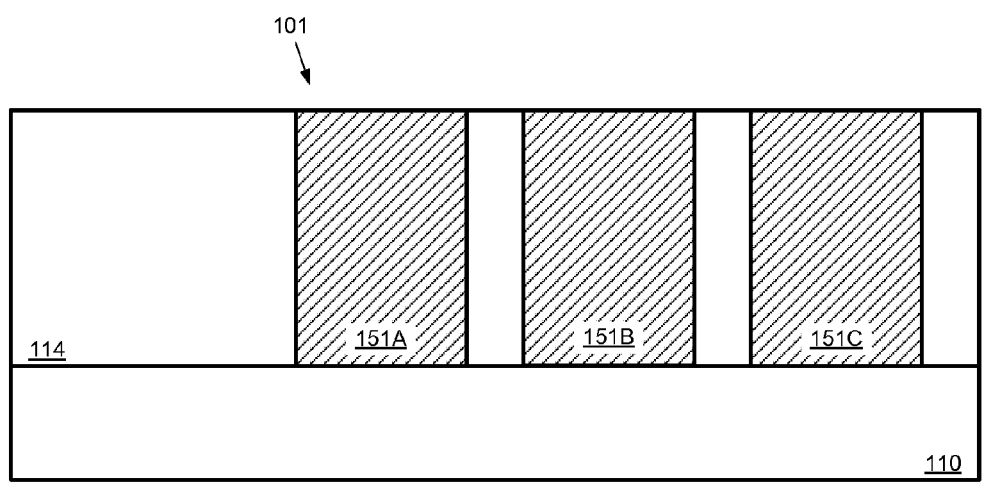

As another example, FIG. 1B provides a pictorial illustration of a second metal-containing layer patterning scheme. Therein, a plurality of device structures 101 are formed on a substrate 110 by preparing a dielectric layer 114, such as a silicon nitride layer or a silicon oxide layer, and filling the pattern formed in the dielectric layer 114 with a metal-containing layer (151A, 151B, 151C). The metal-containing layer (151A, 151B, 151C) may include a metal, a metal alloy, a metal oxide, a metal nitride, or a metal silicate. Accordingly, there exists the need to etch back the metal-containing layer (151A, 151B, 151C) while achieving acceptable etch selectivity between the metal-containing layer and other materials on the substrate.

In both cases, it is important to break through any metal oxide formed at the exposed surface of the metal-containing layer, and controllably etch the metal-containing layer. For example, in the latter, it is important to break through any metal oxide formed at the exposed surface of the metal-containing layer (151A, 151B, 151C), and controllably etch the metal-containing layer (151A, 151B, 151C) to an etch depth ranging up to about 300 Angstrom (e.g., up to about 200 Angstrom, or ranging from about 50 Angstrom to about 200 Angstrom). Furthermore, it is important to etch the metal-containing layer (151A, 151B, 151C) with selectivity to the dielectric layer 114. Further yet, it is important to etch the metal-containing layer (151A, 151B, 151C) uniformly across substrate 110.

Figure 1C:
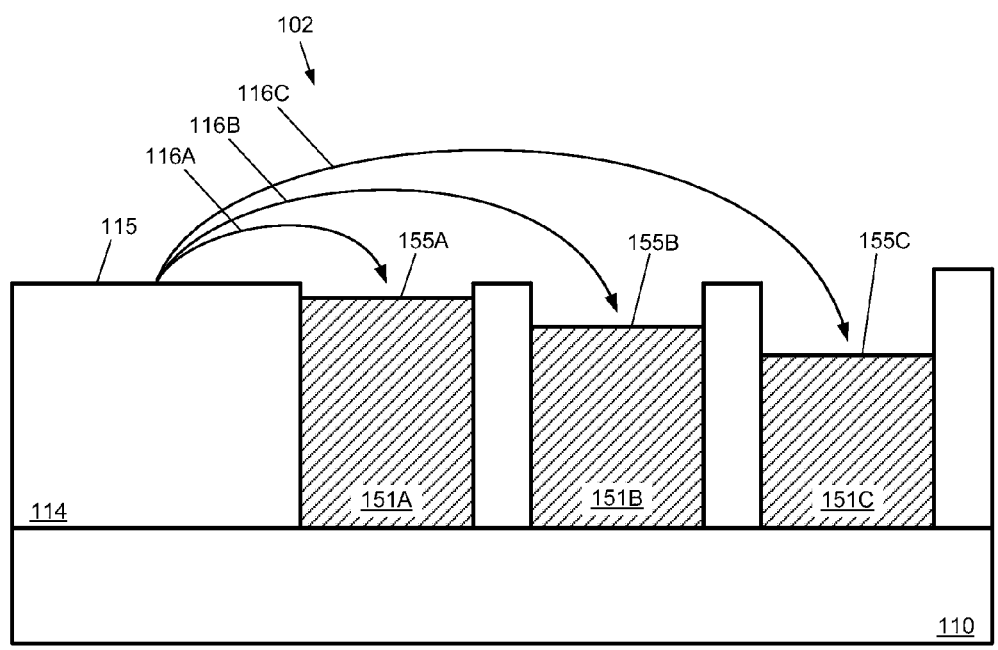

As illustrated in FIG. 1C, a plurality of device structures 102 are formed by filling the pattern formed in the dielectric layer 114 with a metal-containing layer (152A, 152B, 152C). During the etching of the metal-containing layer (152A, 152B, 152C), exposed metal surfaces (155A, 155B, 155C) of the metal-containing layer (152A, 152B, 152C) evolve downward, thus, forming recesses in the metal-containing layer (152A, 152B, 152C). However, the evolution of the exposed metal surfaces (155A, 155B, 155C) proceeds non-uniformly due to the evolution of oxygen from exposed dielectric surface 115 as an etch byproduct of the consumption of the dielectric layer 114 during the etching of the metal-containing layer (152A, 152B, 152C). Differences in diffusion paths (116A, 116B, 116C) of oxygen from the exposed dielectric surface 115 to various exposed metal surfaces (155A, 155B, 155C) causes variations in the oxidation rate of these exposed metal surfaces, thus, establishing a pattern dependency of the etching of the metal-containing layer (152A, 152B, 152C).

Figure 2:
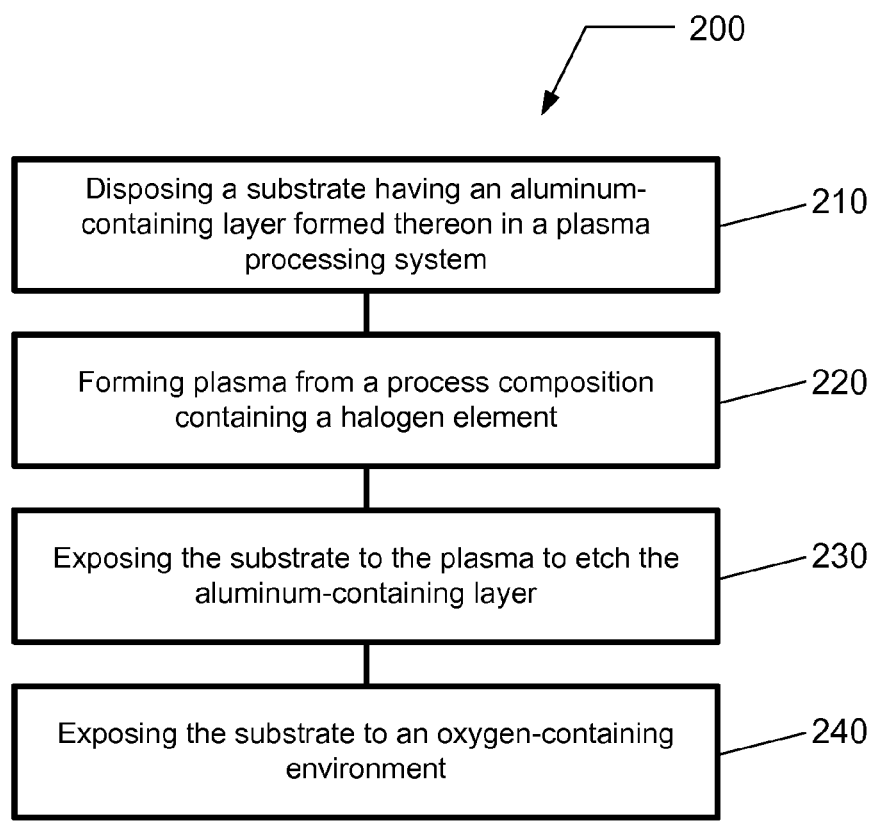
FIG. 2 provides a flow chart illustrating a method for etching a metal-containing layer on a substrate according to an embodiment.

Therefore, according to an embodiment, a method for etching a metal-containing layer on a substrate is illustrated in FIG. 2. As presented in FIG. 2, the method comprises a flow chart 200 beginning in 210 with disposing a substrate having a metal-containing layer formed thereon in a plasma processing system. The metal-containing layer may comprise a metal, a metal alloy, a metal nitride, or a metal oxide, or combinations thereof. Further, the metal-containing layer may include an aluminum-containing layer, such as aluminum, aluminum alloy, or aluminum oxide ($AlO_x$), or combinations thereof. For example, the metal-containing layer may include a bulk aluminum layer with an aluminum oxide surface layer. Additionally, for example, the metal-containing layer may be utilized in a semiconductor device. Additionally yet, for example, the metal-containing layer may be integrated in a device structure (e.g., device structure 100, 101) depicted in FIGS. 1A and 1B.

The substrate may include a bulk silicon substrate, a single crystal silicon (doped or un-doped) substrate, a semiconductor-on-insulator (SOI) substrate, or any other semiconductor substrate containing, for example, Si, SiC, SiGe, SiGeC, Ge, GaAs, InAs, InP, as well as other III/V or II/VI compound semiconductors, or any combination thereof. The substrate can be of any size, for example a 200 mm (millimeter) substrate, a 300 mm substrate, or an even larger substrate.

In 220, plasma is formed from a process composition containing a halogen element. The process composition may include a halogen element and one or more elements selected from the group consisting of C, H, F, Cl, and Br. Additionally, the process composition may include Br and one or more elements selected from the group consisting of C, H, F, and Cl.

The process composition may contain a fluorine-containing gas, a chlorine-containing gas, a bromine-containing gas, a halide gas, or a halomethane gas, or any combination of two or more thereof. For example, the process composition may include $F_2$, $Cl_2$, $Br_2$, $BCl_3$, $NF_3$, or $SF_6$. Additionally, for example, the process composition may include a halide, such as HF, HCl, HBr, or HI. Furthermore, for example, the process composition may include a halomethane, such as a mono-substituted halomethane (e.g., $CH_3F$), a di-substituted halomethane (e.g., $CH_2F_2$), a tri-substituted halomethane (e.g., $CHF_3$), or a tetra-substituted halomethane (e.g., $CF_4$).

The process composition may further include an additive gas containing C and one or more elements selected from the group consisting of H, F, Cl, Br, and I. For example, the process composition may further include a hydrocarbon (i.e., $C_xH_y$, where x and y are equal to unity or greater). Alternatively, for example, the process composition may further include a fluorocarbon (i.e., $C_xF_y$, where x and y are equal to unity or greater). Alternatively yet, for example, the process composition may further include an additive gas having the chemical formula $C_xH_yR_z$, where R is a halogen element, x and y are equal to unity or greater, and z is equal to zero or greater.

In one embodiment, when etching an aluminum-containing layer, the process composition may include HBr.

In another embodiment, when etching an aluminum-containing layer, the process composition may include HBr and an additive gas containing C and one or more elements selected from the group consisting of H, F, Cl, Br, and I.

In another embodiment, when etching an aluminum-containing layer, the process composition may include HBr and an additive gas having the chemical formula $C_xH_yF_z$, where x, y and z are equal to unity or greater.

In yet another embodiment, when etching an aluminum-containing layer, the process composition may include HBr and an additive gas having the chemical formula $CH_3F$.

In 230, the substrate is exposed to the plasma to etch the metal-containing layer. The method of etching the metal-containing layer may include preparation of an etch process recipe. The etch process recipe may include one or more process conditions defined by one or more process parameters. The one or more process conditions may be established by setting one or more process parameters, such as: setting a flow rate of the process composition; setting a pressure in the plasma processing system; setting a first radio frequency (RF) power level for a first RF signal applied to a lower electrode within a substrate holder for supporting and electrically biasing the substrate; setting a second RF (or microwave) power level for a second RF signal applied to a source antenna or electrode opposing the lower electrode above the substrate; setting a temperature condition for the plasma processing system; setting a temperature condition for the substrate or substrate holder; setting an etch time; and/or setting an over-etch time. During the method of etching, any one of the process parameters may be varied.

In one embodiment, the method of etching may comprise a process parameter space that includes: a chamber pressure ranging up to about 1000 mtorr (millitorr) (e.g., up to about 200 mtorr, or ranging from about 30 to about 100 mtorr), a halogen-containing gas flow rate ranging up to about 2000 sccm (standard cubic centimeters per minute) (e.g., up to about 1000 sccm, or about 1 sccm to about 200 sccm), an optional additive gas flow rate ranging up to about 2000 sccm (e.g., up to about 1000 sccm, or up to about 100 sccm, or up to about 10 sccm, or ranging from about 1 sccm to about 10 sccm), an optional noble gas (e.g., He or Ar) flow rate ranging up to about 2000 sccm (e.g., up to about 1000 sccm, or up to about 500 sccm), a SWP (surface wave plasma) source (e.g., element 1180 in FIG. 11) power ranging up to about 3000 W (watts) (e.g., up to about 2500 W, or ranging from about 1500 W to about 2500 W), and a lower electrode (e.g., element 522 in FIG. 11) RF power level for electrically biasing the substrate ranging up to about 1000 W (e.g., up to about 500 W, or up to about 200 W, or up to 100 W). Also, the SWP source can operate at a microwave frequency, e.g., 2.48 GHz. In addition, the lower electrode bias frequency can range from about 0.1 MHz to about 100 MHz, e.g., about 2 MHz or 13.56 MHz.

In 240, the substrate may be exposed further to an oxygen-containing environment to oxidize an exposed surface of the metal-containing layer and control an etch rate of the metal-containing layer. For example, when etching an aluminum-containing layer, the etch rate for aluminum oxide using an HBr-based process composition is less than the etch rate for aluminum. Through the addition of oxygen, the etch rate for the metal-containing layer may be reduced to less than or equal to about 100 Angstrom per minute (min), or less than or equal to about 50 Angstrom per min. Thus, the amount of the metal-containing layer (e.g., depth or thickness) removed may be relatively more controllable. Additionally, through the addition of oxygen, the pattern deficiency noted above in FIG. 3C may be reduced or even eliminated. Herein, the inventors suspect that oxygen addition may dilute and eradicate the pattern dependent evolution of oxygen from oxide surfaces adjacent the metal-containing layers being etched.

The oxygen-containing environment may contain atomic oxygen, diatomic oxygen, triatomic oxygen, metastable oxygen, excited oxygen, ionized oxygen, oxygen-containing radical, etc. The oxygen-containing environment may contain $O$, $O_2$, $O_3$, $CO$, $CO_2$, $NO$, $N_2O$, or $NO_2$, or any combination of two or more thereof. The oxygen-containing environment may include an oxygen-containing plasma. The generation of the oxygen-containing plasma may be located in-situ or ex-situ relative to the substrate.

Figure 3A:
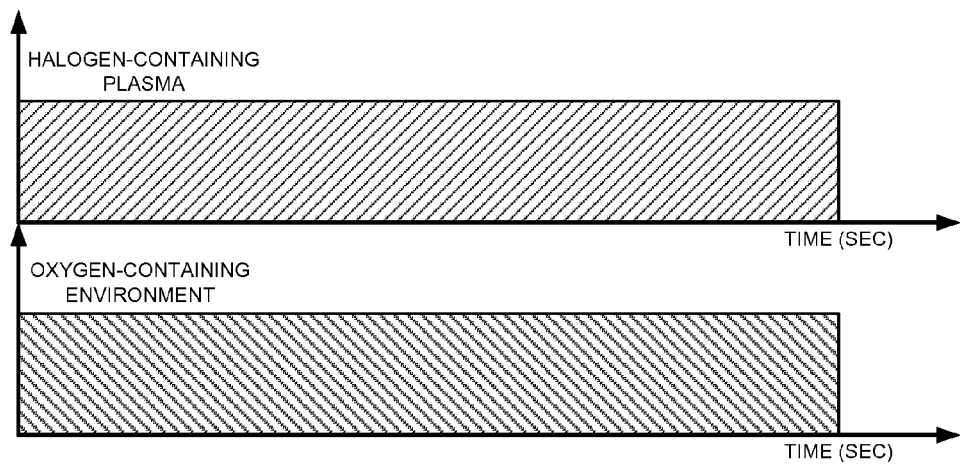
FIGS. 3A through 3C illustrate a schematic representation of a procedure for etching a metal-containing layer on a substrate according to other embodiments.

As illustrated in FIG. 3A, the exposing of the substrate to the plasma (e.g., halogen-containing plasma) may be performed simultaneously with the exposing the substrate to the oxygen-containing environment. For example, the process composition for forming plasma may include an oxygen-containing gas.

Figure 3B:
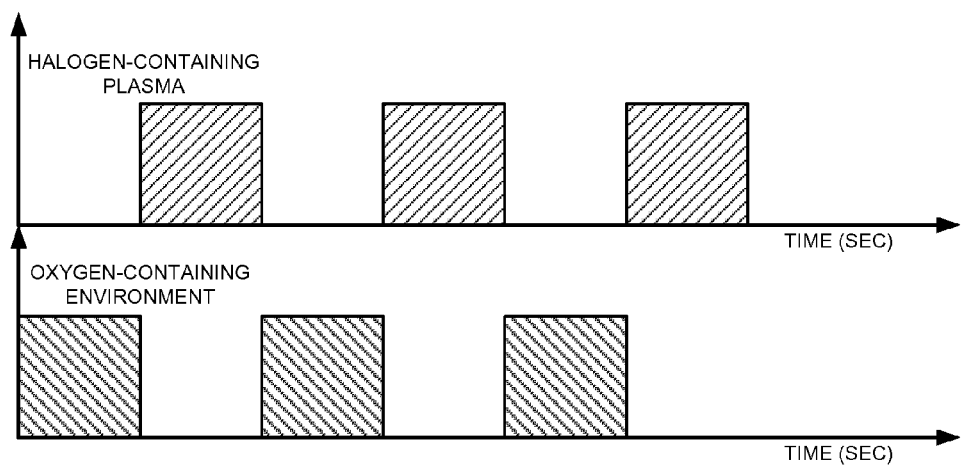

As illustrated in FIG. 3B, the exposing of the substrate to the plasma (e.g., halogen-containing plasma) may be performed sequentially with the exposing the substrate to the oxygen-containing environment. For example, the substrate may be exposed to the oxygen-containing environment and, thereafter, the substrate may be exposed to the plasma. Also, as shown in FIG. 3B, the exposing of the substrate to the plasma may be performed sequentially and alternatingly with the exposing the substrate to the oxygen-containing environment for one or more exposure cycles. For example, the substrate may be exposed to the oxygen-containing environment and, thereafter, the substrate may be exposed to the plasma, thus, defining an exposure cycle, which may be repeated.

Figure 3C:
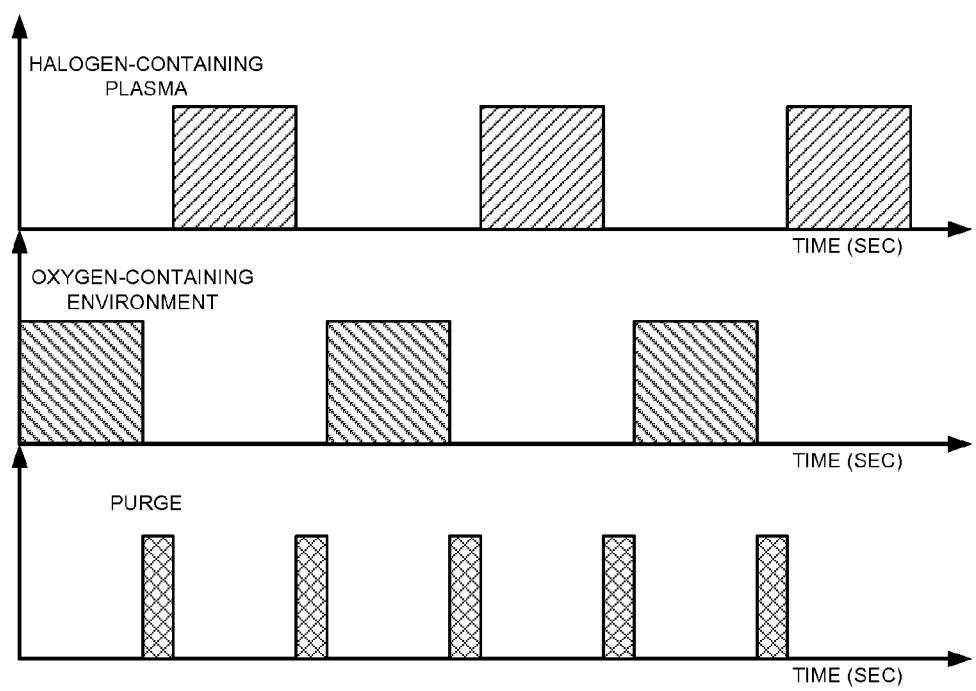

As illustrated in FIG. 3C, when performing both the exposing of the substrate to the plasma (e.g., halogen-containing plasma) and the exposing of the substrate to the oxygen-containing environment in the plasma processing system, the method may further include at least one purging step for the plasma processing system inserted between the exposing the substrate to plasma and the exposing the substrate to the oxygen-containing environment.

Figure 4:
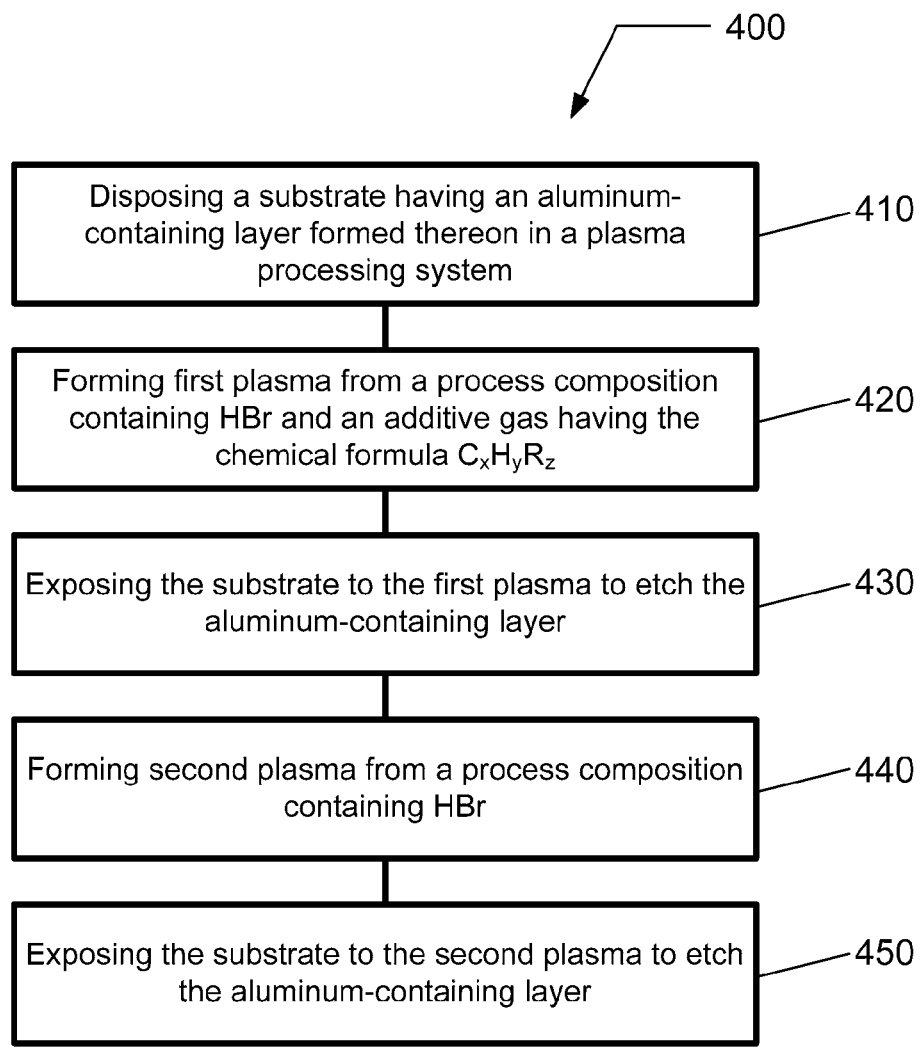
FIG. 4 provides a flow chart illustrating a method for etching a metal-containing layer on a substrate according to another embodiment.

According to another embodiment, a method for etching a metal-containing layer on a substrate is illustrated in FIG. 4. As described in FIG. 4, the method comprises a flow chart 400 beginning in 410 with disposing a substrate having both an aluminum-containing layer and a layer containing Si and O formed thereon in a plasma processing system. For example, the aluminum-containing layer may include a bulk aluminum layer with an aluminum oxide surface layer, and the layer containing Si and O may include silicon oxide.

The method for etching may include, in 420, forming first plasma from a process composition containing HBr and an additive gas having the chemical formula $C_xH_yR_z$, wherein R is a halogen element, x and y are equal to unity or greater, and z is equal to zero or greater, and, in 430, exposing the substrate to the first plasma to break through the aluminum oxide surface layer. Thereafter, the method may further include, in 440, forming second plasma from a process composition containing HBr, and, in 450, exposing the substrate to the second plasma to etch the bulk aluminum.

According to yet another embodiment, when it is desirable to achieve a target etch selectivity between etching the metal-containing layer, such as the aluminum-containing layer, and another layer on the substrate, such as the layer containing Si and O (e.g., oxide layer 114 in FIGS. 1B and 1C), at least one of the process parameters noted above may be varied. For example, the etch selectivity between aluminum oxide and silicon oxide (i.e., the ratio of the aluminum oxide etch rate to the silicon oxide etch rate) may be increased by decreasing or terminating the first RF power level for the electrical bias of the substrate (i.e., zero-bias condition).

Figure 10:
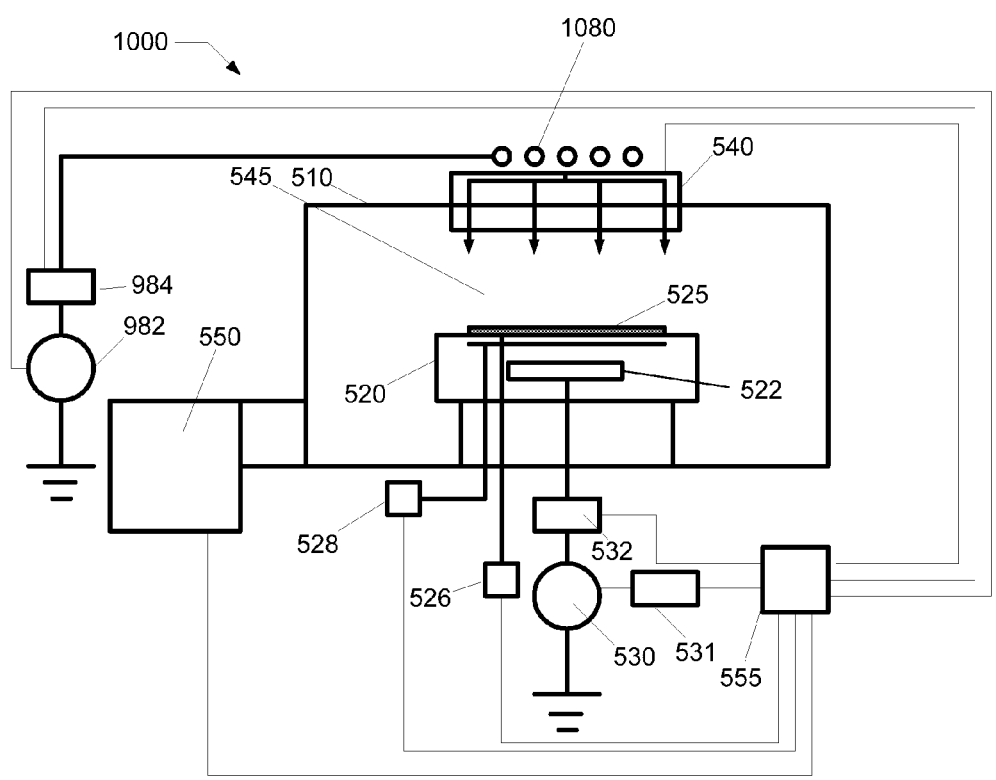
FIG. 10 shows a schematic representation of a plasma processing system according to another embodiment.
Figure 11:
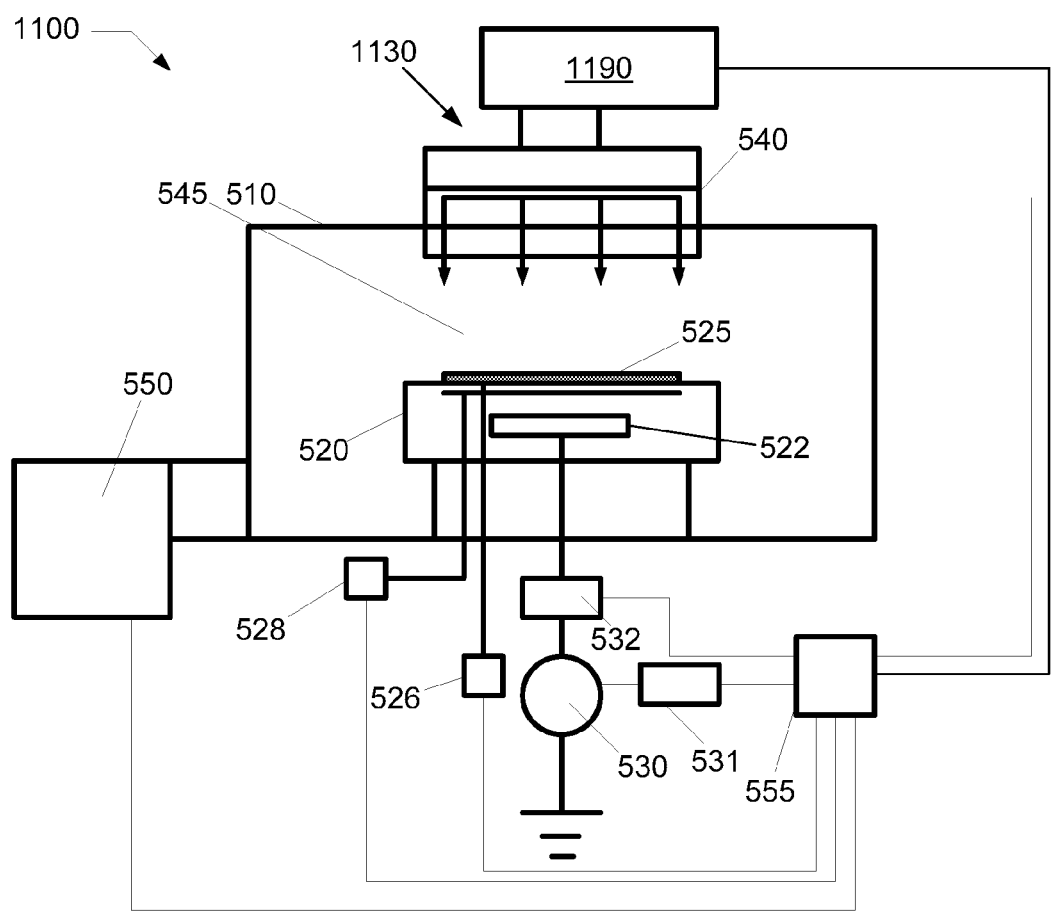
FIG. 11 shows a schematic representation of a plasma processing system according to another embodiment.

One or more of the methods for etching a metal-containing layer described above may be performed utilizing a plasma processing system such as the one described in FIG. 11. However, the methods discussed are not to be limited in scope by this exemplary presentation. The method of etching a metal-containing layer on a substrate according to various embodiments described above may be performed in any one of the plasma processing systems illustrated in FIGS. 5 through 11 and described below.

Figure 5:
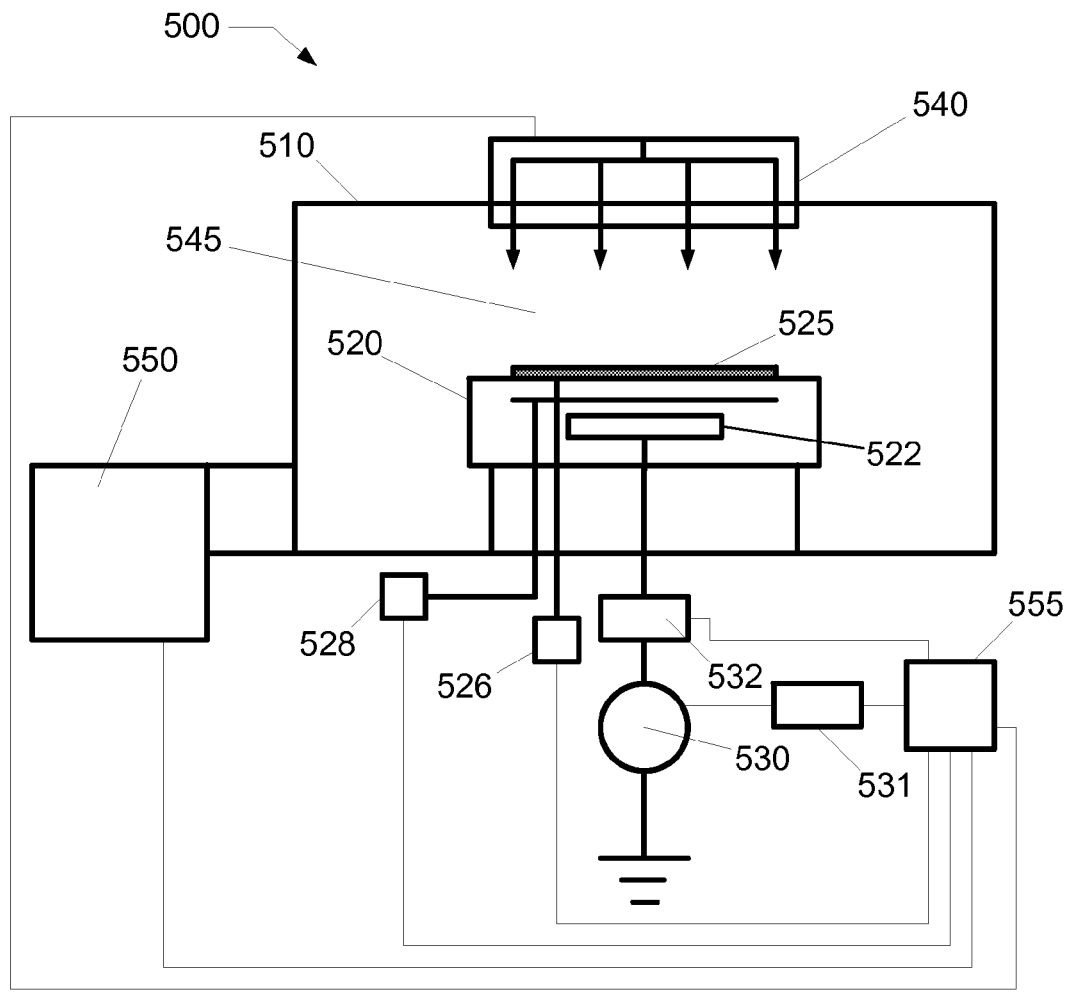
FIG. 5 shows a schematic representation of a plasma processing system according to an embodiment.

According to one embodiment, a plasma processing system 500 configured to perform the above identified process conditions is depicted in FIG. 5 comprising a plasma processing chamber 510, substrate holder 520, upon which a substrate 525 to be processed is affixed, and vacuum pumping system 550. Substrate 525 can be a semiconductor substrate, a wafer, a flat panel display, or a liquid crystal display. Plasma processing chamber 510 can be configured to facilitate the generation of plasma in plasma processing region 545 in the vicinity of a surface of substrate 525. An ionizable gas or mixture of process gases is introduced via a gas distribution system 540. For a given flow of process gas, the process pressure is adjusted using the vacuum pumping system 550. Plasma can be utilized to create materials specific to a pre-determined materials process, and/or to aid the removal of material from the exposed surfaces of substrate 525. The plasma processing system 500 can be configured to process substrates of any desired size, such as 200 mm substrates, 300 mm substrates, or larger.

Substrate 525 can be affixed to the substrate holder 520 via a clamping system 528, such as a mechanical clamping system or an electrical clamping system (e.g., an electrostatic clamping system). Furthermore, substrate holder 520 can include a heating system (not shown) or a cooling system (not shown) that is configured to adjust and/or control the temperature of substrate holder 520 and substrate 525. The heating system or cooling system may comprise a re-circulating flow of heat transfer fluid that receives heat from substrate holder 520 and transfers heat to a heat exchanger system (not shown) when cooling, or transfers heat from the heat exchanger system to substrate holder 520 when heating. In other embodiments, heating/cooling elements, such as resistive heating elements, or thermo-electric heaters/coolers can be included in the substrate holder 520, as well as the chamber wall of the plasma processing chamber 510 and any other component within the plasma processing system 500.

Additionally, a heat transfer gas can be delivered to the backside of substrate 525 via a backside gas supply system 526 in order to improve the gas-gap thermal conductance between substrate 525 and substrate holder 520. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 525.

In the embodiment shown in FIG. 5, substrate holder 520 can comprise an electrode 522 through which RF power is coupled to the processing plasma in plasma processing region 545. For example, substrate holder 520 can be electrically biased at a RF voltage via the transmission of RF power from a RF generator 530 through an optional impedance match network 532 to substrate holder 520. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Furthermore, the electrical bias of electrode 522 at a RF voltage may be pulsed using pulsed bias signal controller 531. The RF power output from the RF generator 530 may be pulsed between an off-state and an on-state, for example.

Alternately, RF power is applied to the substrate holder electrode at multiple frequencies. Furthermore, impedance match network 532 can improve the transfer of RF power to plasma in plasma processing chamber 510 by reducing the reflected power. Match network topologies (e.g. L-type, π-type, T-type, etc.) and automatic control methods are well known to those skilled in the art.

Gas distribution system 540 may comprise a showerhead design for introducing a mixture of process gases. Alternatively, gas distribution system 540 may comprise a multi-zone showerhead design for introducing a mixture of process gases and adjusting the distribution of the mixture of process gases above substrate 525. For example, the multi-zone showerhead design may be configured to adjust the process gas flow or composition to a substantially peripheral region above substrate 525 relative to the amount of process gas flow or composition to a substantially central region above substrate 525.

Vacuum pumping system 550 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 510.

Controller 555 comprises a microprocessor, memory, and a digital I/O port capable of generating control voltages sufficient to communicate and activate inputs to plasma processing system 500 as well as monitor outputs from plasma processing system 500. Moreover, controller 555 can be coupled to and can exchange information with RF generator 530, pulsed bias signal controller 531, impedance match network 532, the gas distribution system 540, vacuum pumping system 550, as well as the substrate heating/cooling system (not shown), the backside gas supply system 526, and/or the electrostatic clamping system 528. For example, a program stored in the memory can be utilized to activate the inputs to the aforementioned components of plasma processing system 500 according to a process recipe in order to perform a plasma assisted process, such as a plasma etch process, on substrate 525.

Controller 555 can be locally located relative to the plasma processing system 500, or it can be remotely located relative to the plasma processing system 500. For example, controller 555 can exchange data with plasma processing system 500 using a direct connection, an intranet, and/or the internet. Controller 555 can be coupled to an intranet at, for example, a customer site (i.e., a device maker, etc.), or it can be coupled to an intranet at, for example, a vendor site (i.e., an equipment manufacturer). Alternatively or additionally, controller 555 can be coupled to the internet. Furthermore, another computer (i.e., controller, server, etc.) can access controller 555 to exchange data via a direct connection, an intranet, and/or the internet.

In the embodiment shown in FIG. 6, plasma processing system 600 can be similar to the embodiment of FIG. 5 and further comprise either a stationary, or mechanically or electrically rotating magnetic field system 660, in order to potentially increase plasma density and/or improve plasma processing uniformity, in addition to those components described with reference to FIG. 5. Moreover, controller 555 can be coupled to magnetic field system 660 in order to regulate the speed of rotation and field strength. The design and implementation of a rotating magnetic field is well known to those skilled in the art.

Figure 6:
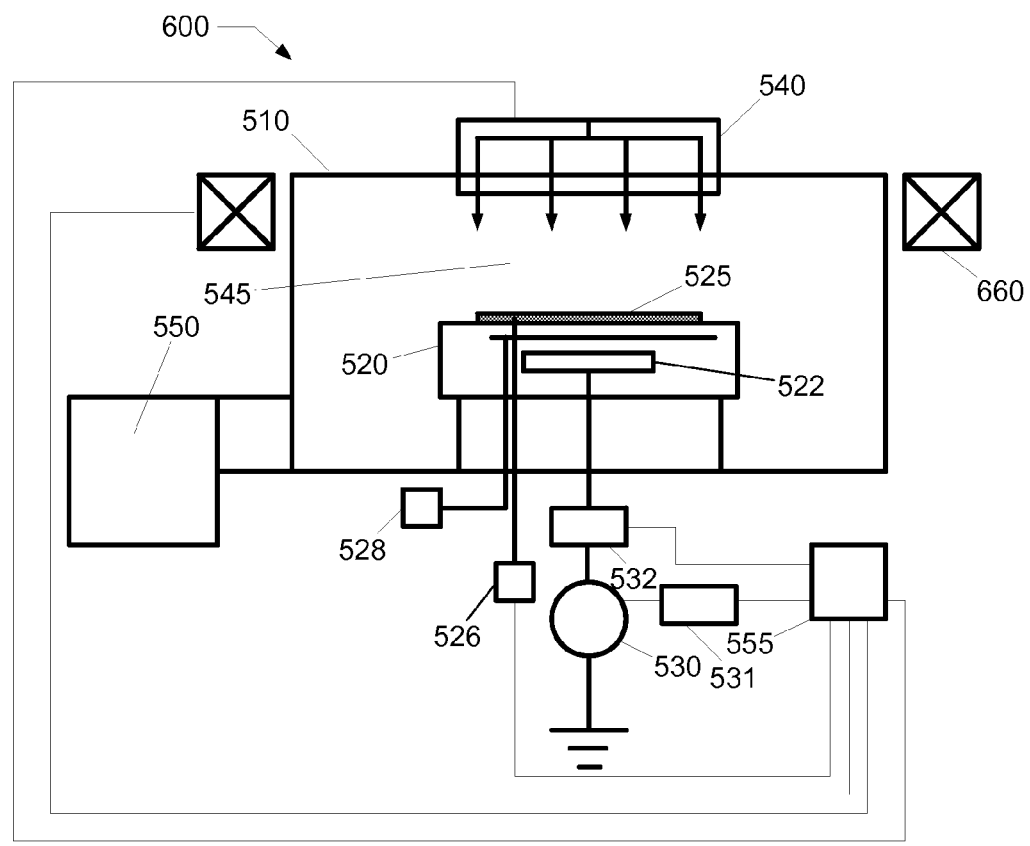
FIG. 6 shows a schematic representation of a plasma processing system according to another embodiment.
Figure 7:
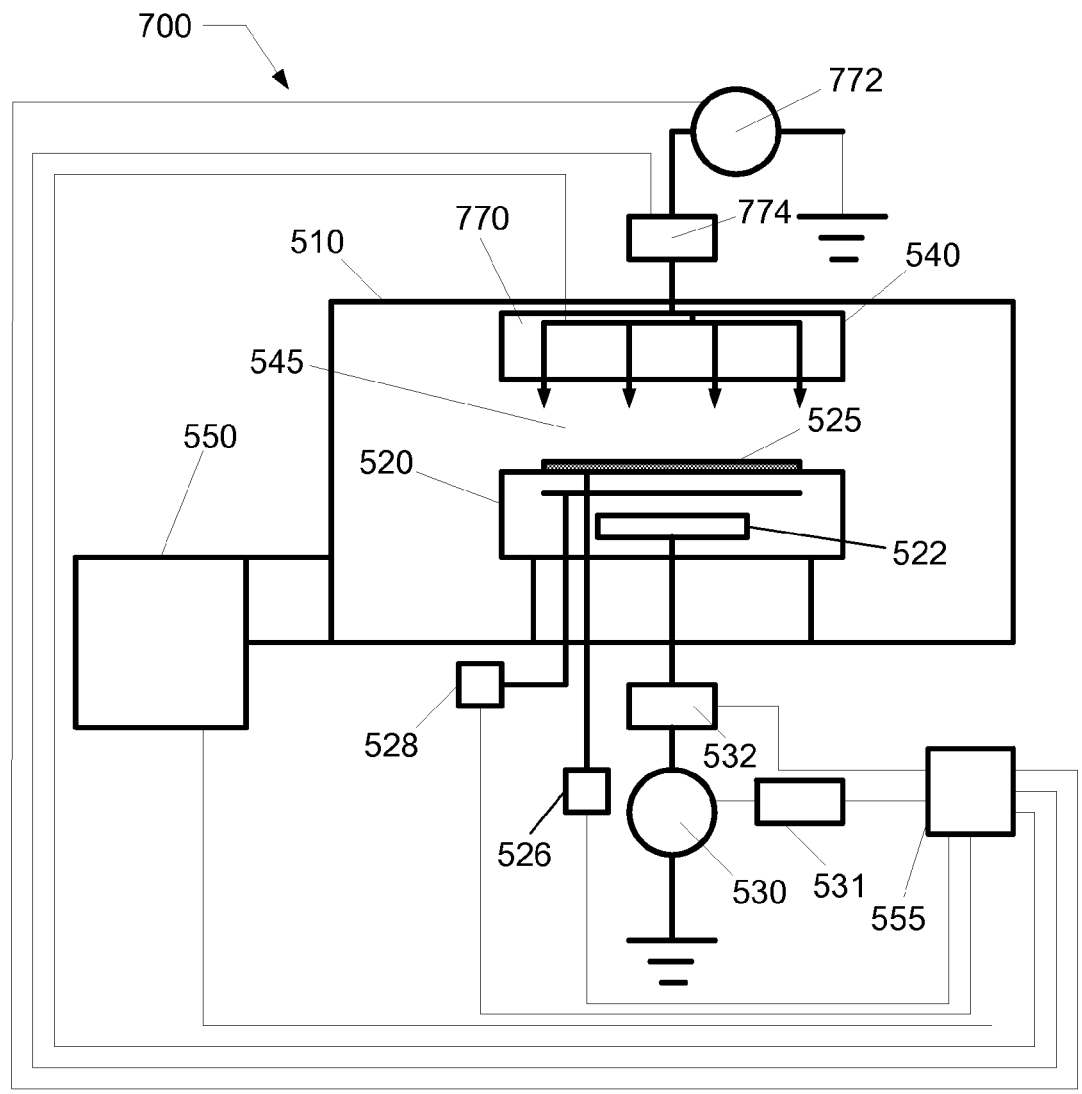
FIG. 7 shows a schematic representation of a plasma processing system according to another embodiment.

In the embodiment shown in FIG. 7, plasma processing system 700 can be similar to the embodiment of FIG. 5 or FIG. 6, and can further comprise an upper electrode 770 to which RF power can be coupled from RF generator 772 through optional impedance match network 774. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 555 is coupled to RF generator 772 and impedance match network 774 in order to control the application of RF power to upper electrode 770. The design and implementation of an upper electrode is well known to those skilled in the art. The upper electrode 770 and the gas distribution system 540 can be designed within the same chamber assembly, as shown. Alternatively, upper electrode 770 may comprise a multi-zone electrode design for adjusting the RF power distribution coupled to plasma above substrate 525. For example, the upper electrode 770 may be segmented into a center electrode and an edge electrode.

Figure 8:
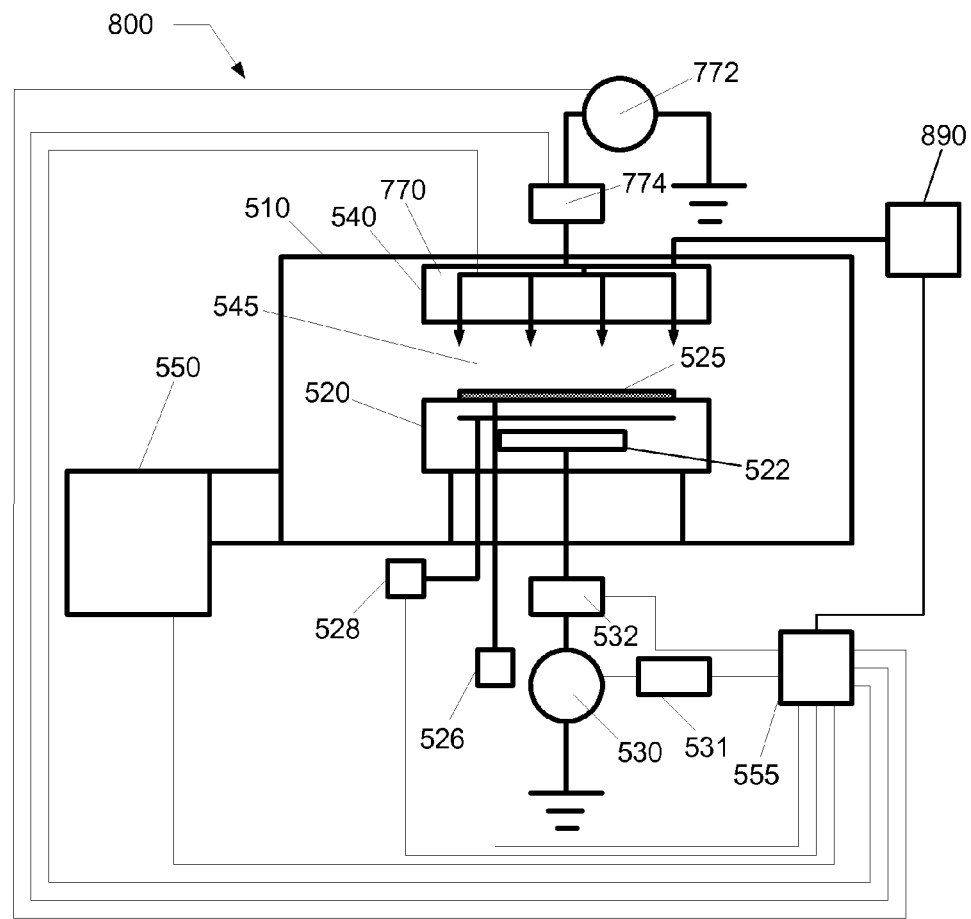
FIG. 8 shows a schematic representation of a plasma processing system according to another embodiment.

In the embodiment shown in FIG. 8, plasma processing system 800 can be similar to the embodiment of FIG. 7, and can further comprise a direct current (DC) power supply 890 coupled to the upper electrode 770 opposing substrate 525. The upper electrode 770 may comprise an electrode plate. The electrode plate may comprise a silicon-containing electrode plate. Moreover, the electrode plate may comprise a doped silicon electrode plate. The DC power supply 890 can include a variable DC power supply. Additionally, the DC power supply 890 can include a bipolar DC power supply. The DC power supply 890 can further include a system configured to perform at least one of monitoring, adjusting, or controlling the polarity, current, voltage, or on/off state of the DC power supply 890. Once plasma is formed, the DC power supply 890 facilitates the formation of a ballistic electron beam. An electrical filter (not shown) may be utilized to de-couple RF power from the DC power supply 890.

For example, the DC voltage applied to upper electrode 770 by DC power supply 890 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 770. The surface of the upper electrode 770 facing the substrate holder 520 may be comprised of a silicon-containing material.

Figure 9:
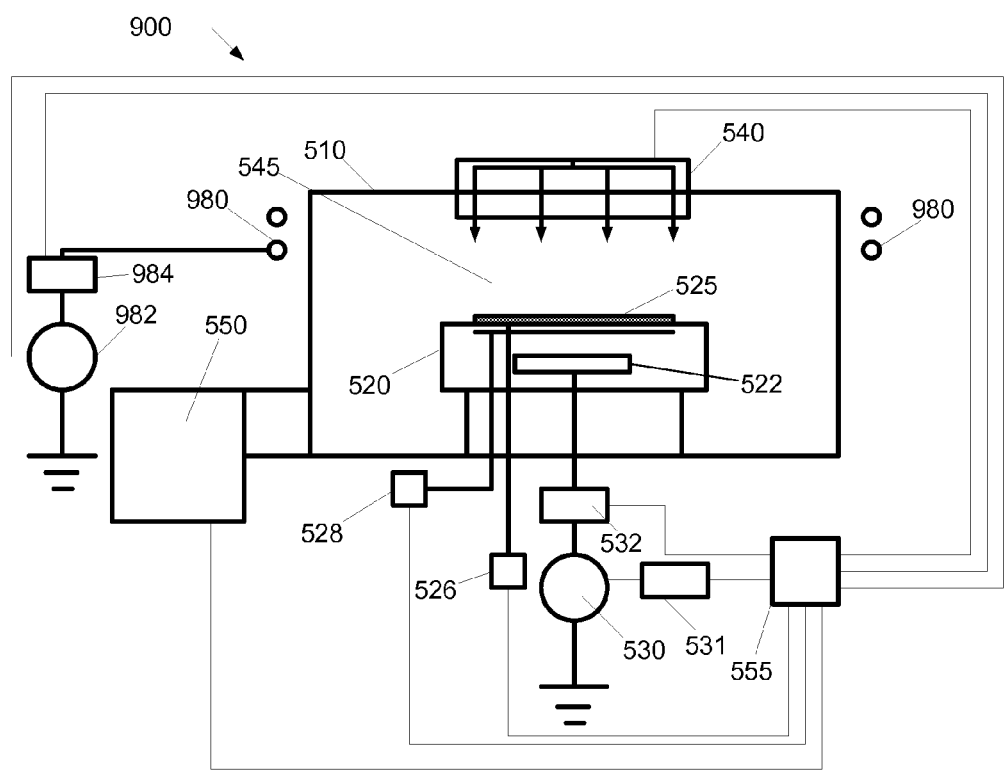
FIG. 9 shows a schematic representation of a plasma processing system according to another embodiment.

In the embodiment shown in FIG. 9, plasma processing system 900 can be similar to the embodiments of FIGS. 5 and 6, and can further comprise an inductive coil 980 to which RF power is coupled via RF generator 982 through optional impedance match network 984. RF power is inductively coupled from inductive coil 980 through a dielectric window (not shown) to plasma processing region 545. A frequency for the application of RF power to the inductive coil 980 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 980 and plasma in the plasma processing region 545. Moreover, controller 555 can be coupled to RF generator 982 and impedance match network 984 in order to control the application of power to inductive coil 980.

In an alternate embodiment, as shown in FIG. 10, plasma processing system 1000 can be similar to the embodiment of FIG. 9, and can further comprise an inductive coil 1080 that is a "spiral" coil or "pancake" coil in communication with the plasma processing region 545 from above as in a transformer coupled plasma (TCP) reactor. The design and implementation of an inductively coupled plasma (ICP) source, or transformer coupled plasma (TCP) source, is well known to those skilled in the art.

Alternately, plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

In the embodiment shown in FIG. 11, plasma processing system 1100 can be similar to the embodiment of FIG. 5, and can further comprise a surface wave plasma (SWP) source 1130. The SWP source 1130 can comprise a slot antenna, such as a radial line slot antenna (RLSA), to which microwave power is coupled via a power coupling system 1190.

Figure 12:
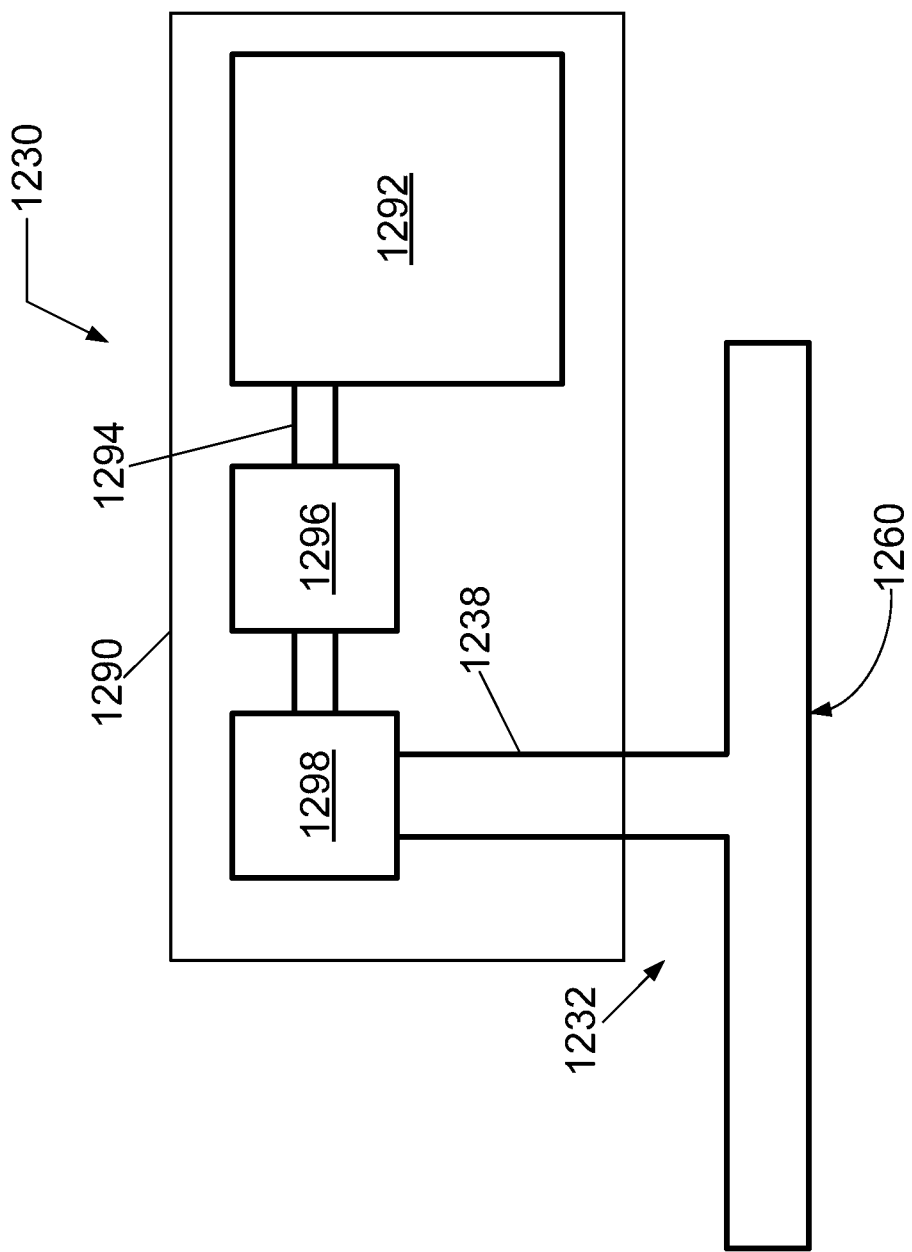
FIG. 12 depicts a cross-sectional view of a plasma source in accordance with one embodiment.

Referring now to FIG. 12, a schematic representation of a SWP source 1230 is provided according to an embodiment. The SWP source 1230 comprises an electromagnetic (EM) wave launcher 1232 configured to couple EM energy in a desired EM wave mode to a plasma by generating a surface wave on a plasma surface 1260 of the EM wave launcher 1232 adjacent plasma. Furthermore, the SWP source 1230 comprises a power coupling system 1290 coupled to the EM wave launcher 1232, and configured to provide the EM energy to the EM wave launcher 1232 for forming the plasma.

The EM wave launcher 1232 includes a microwave launcher configured to radiate microwave power into plasma processing region 545 (see FIG. 11). The EM wave launcher 1232 is coupled to the power coupling system 1290 via coaxial feed 1238 through which microwave energy is transferred. The power coupling system 1290 includes a microwave source 1292, such as a 2.45 GHz microwave power source. Microwave energy generated by the microwave source 1292 is guided through a waveguide 1294 to an isolator 1296 for absorbing microwave energy reflected back to the microwave source 1292. Thereafter, the microwave energy is converted to a coaxial TEM (transverse electromagnetic) mode via a coaxial converter 1298.

A tuner may be employed for impedance matching, and improved power transfer. The microwave energy is coupled to the EM wave launcher 1232 via the coaxial feed 1238, wherein another mode change occurs from the TEM mode in the coaxial feed 1238 to a TM (transverse magnetic) mode. Additional details regarding the design of the coaxial feed 1238 and the EM wave launcher 1232 can be found in U.S. Pat. No. 5,024,716, entitled "Plasma processing apparatus for etching, ashing, and film-formation"; the content of which is herein incorporated by reference in its entirety.

Figure 13A:
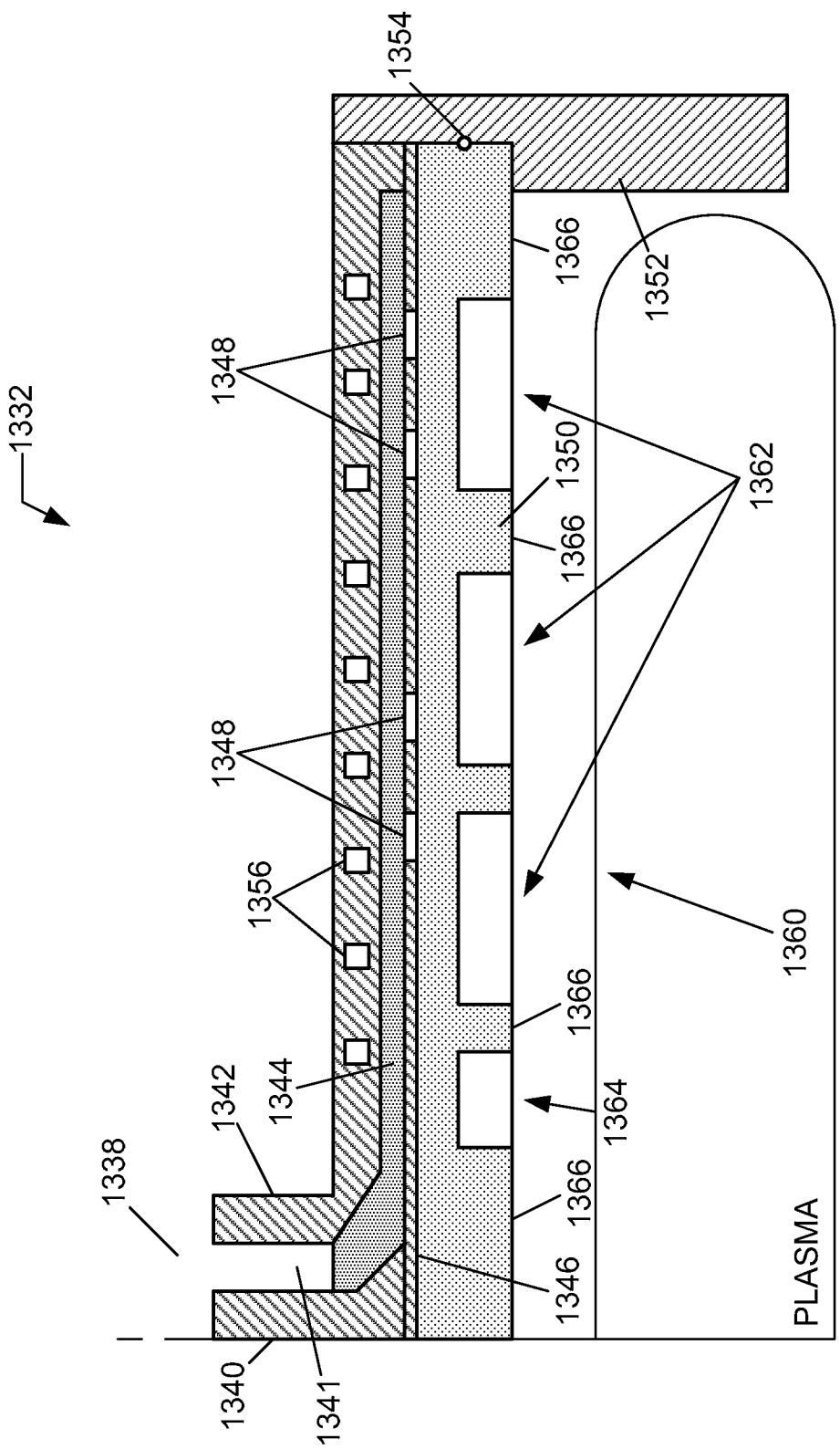
FIGS. 13A and 13B depict a cross-sectional view and bottom view of a plasma source in accordance with another embodiment.
Figure 13B:
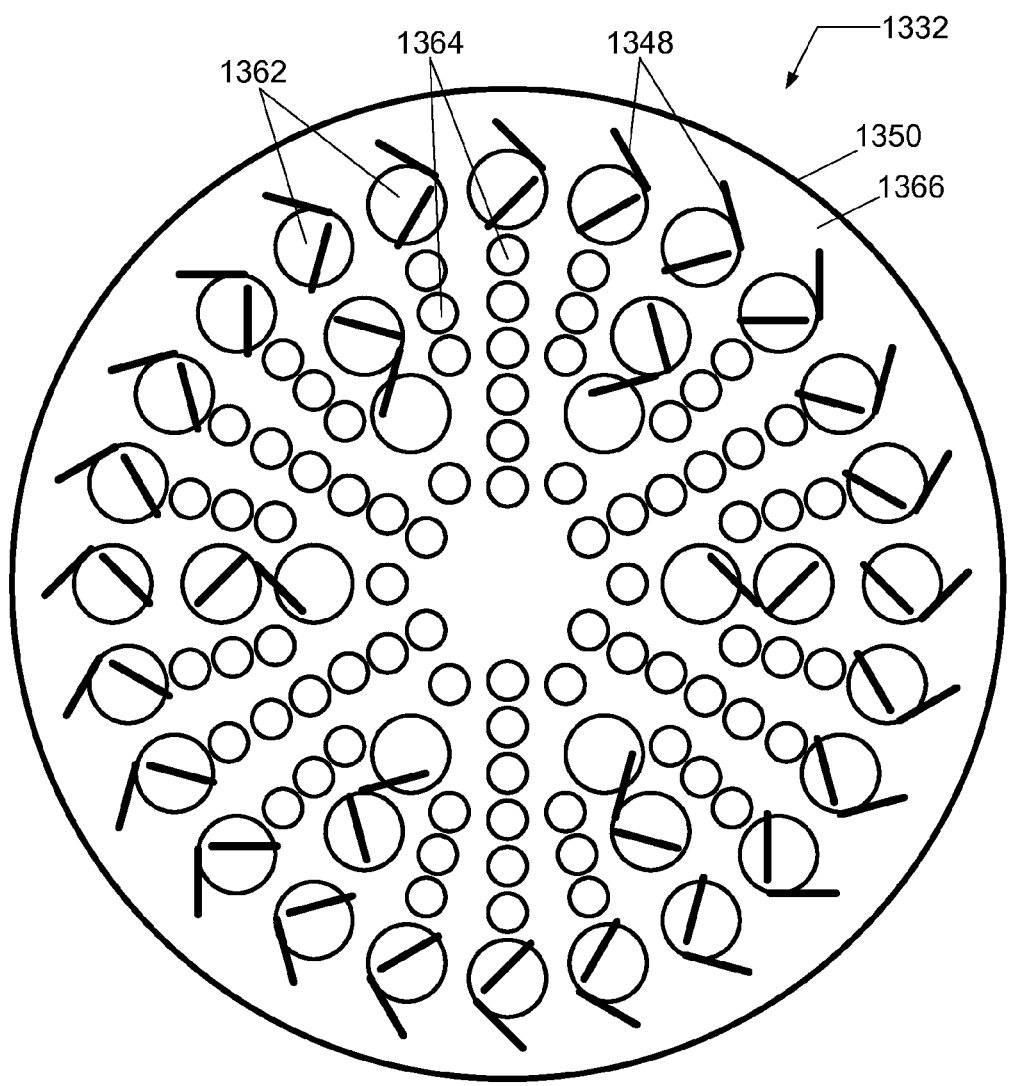

Referring now to FIGS. 13A and 13B, a schematic cross-sectional view and a bottom view, respectively, of an EM wave launcher 1332 are provided according to one embodiment. The EM wave launcher 1332 comprises a coaxial feed 1338 having an inner conductor 1340, an outer conductor 1342, and insulator 1341, such as an air gap, and a slot antenna 1346 having a plurality of slots 1348 coupled between the inner conductor 1340 and the outer conductor 1342 as shown in FIG. 13A. The plurality of slots 1348 permits the coupling of EM energy from a first region above the slot antenna 1346 to a second region below the slot antenna 1346, wherein plasma is formed adjacent a plasma surface 1360 on the EM wave launcher 1332. The EM wave launcher 1332 may further comprise a slow wave plate 1344, and a resonator plate 1350.

The number, geometry, size, and distribution of the slots 1348 are all factors that can contribute to the spatial uniformity of the plasma formed in the plasma processing region 545 (see FIG. 11). Thus, the design of the slot antenna 1346 may be used to control the spatial uniformity of the plasma in the plasma processing region 545 (see FIG. 11).

As shown in FIG. 13A, the EM wave launcher 1332 may comprise a fluid channel 1356 that is configured to flow a temperature control fluid for temperature control of the EM wave launcher 1332. Although not shown, the EM wave launcher 1332 may further be configured to introduce a process gas through the plasma surface 1360 to the plasma. Although not shown, a gas distribution system, such as the gas distribution system (540) of FIG. 11, may be connected to the EM wave launcher 1332 and/or the chamber wall 1352 for introducing a process gas into the process chamber.

Referring still to FIG. 13A, the EM wave launcher 1332 may be coupled to an upper chamber portion of a plasma processing system, wherein a vacuum seal can be formed between an upper chamber wall 1352 and the EM wave launcher 1332 using a sealing device 1354. The sealing device 1354 can include an elastomer O-ring; however, other known sealing mechanisms may be used.

In general, the inner conductor 1340 and the outer conductor 1342 of the coaxial feed 1338 comprise a conductive material, such as a metal, while the slow wave plate 1344 and the resonator plate 1350 comprise a dielectric material. In the latter, the slow wave plate 1344 and the resonator plate 1350 preferably comprise the same material; however, different materials may be used. The material selected for fabrication of the slow wave plate 1344 is chosen to reduce the wavelength of the propagating electromagnetic (EM) wave relative to the corresponding free-space wavelength, and the dimensions of the slow wave plate 1344 and the resonator plate 1350 are chosen to ensure the formation of a standing wave effective for radiating EM energy into the plasma processing region 545 (see FIG. 11).

The slow wave plate 1344 and the resonator plate 1350 can be fabricated from a dielectric material, including silicon-containing materials such as quartz (silicon dioxide), or a high dielectric constant (high-k) materials. For example, the high-k material may possess a dielectric constant greater than a value of 4. In particular, when the plasma processing system is utilized for etch process applications, quartz is often chosen for compatibility with the etch process.

For example, the high-k material can include intrinsic crystal silicon, alumina ceramic, aluminum nitride, and sapphire. However, other high-k materials may be used. Moreover, a particular high-k material may be selected in accordance with the parameters of a particular process. For example, when the resonator plate 1350 is fabricated from intrinsic crystal silicon, the plasma frequency exceeds 2.45 GHz at a temperature of 45 degrees C. Therefore, intrinsic crystal silicon is appropriate for low temperature processes (i.e., less than 45 degrees C.). For higher temperature processes, the resonator plate 1350 can be fabricated from alumina ($Al_2O_3$), or sapphire.

Plasma uniformity and plasma stability may remain as challenges for the practical implementation of a SWP source as described above. In the latter, the standing wave at the resonator plate-plasma interface, i.e., at the plasma surface 1360, may be prone to mode jumps as plasma parameters shift.

As shown in FIGS. 13A and 13B, the EM wave launcher 1332 may be fabricated with a first recess configuration 1362 formed in the plasma surface 1360 and optionally a second recess configuration 1364 formed in the plasma surface 1360 according to one embodiment.

The first recess configuration 1362 may comprise a first plurality of recesses. Each recess in the first recess configuration 1362 may comprise a unique indentation or dimple formed within the plasma surface 1360. For example, a recess in the first recess configuration 1362 may comprise a cylindrical geometry, a conical geometry, a frusto-conical geometry, a spherical geometry, an aspherical geometry, a rectangular geometry, a pyramidal geometry, or any arbitrary shape. The first recess distribution 1362 may comprise recesses characterized by a first size (e.g., latitudinal dimension (or width), and/or longitudinal dimension (or depth)).

The second recess configuration 1364 may comprise a plurality of recesses. Each recess in the second recess configuration 1364 may comprise a unique indentation or dimple formed within the plasma surface 1360. For example, a recess in the second recess configuration 1364 may comprise a cylindrical geometry, a conical geometry, a frusto-conical geometry, a spherical geometry, an aspherical geometry, a rectangular geometry, a pyramidal geometry, or any arbitrary shape. The second recess distribution 1364 may comprise recesses characterized by a second size (e.g., latitudinal dimension (or width), and/or longitudinal dimension (or depth)). The first size of the recesses in the first recess configuration 1362 may or may not be the same as the second size of the recesses in the second recess configuration 1364. For instance, the second size may be smaller than the first size.

As shown in FIGS. 13A and 13B, the resonator plate 1350 comprises a dielectric plate having a plate diameter and a plate thickness. Therein, the plasma surface 1360 on resonator plate 1350 comprises a planar surface 1366 within which the first recess configuration 1362 and the second recess configuration 1364 are formed. Alternatively, the resonator plate 1350 comprises a non-planar geometry or an arbitrary geometry. Therein, the plasma surface 1360 may comprise a non-planar surface within which the first recess configuration and the second recess configuration are formed (not shown). For example, the non-planar surface may be concave, or convex, or a combination thereof.

The propagation of EM energy in the resonator plate 1350 may be characterized by an effective wavelength ($\lambda$) for a given frequency of EM energy and dielectric constant for the resonator plate 1350. The plate thickness may be an integer number of quarter wavelengths (n $\lambda/4$, where n is an integer greater than zero) or an integer number of half wavelengths (m $\lambda/2$, where m is an integer greater than zero). For instance, the plate thickness may be about half the effective wavelength ($\lambda/2$) or greater than half the effective wavelength ($>\lambda/2$). Alternatively, the plate thickness may be a non-integral fraction of the effective wavelength (i.e., not an integral number of half or quarter wavelengths). Alternatively yet, the plate thickness may range from about 25 mm (millimeters) to about 45 mm.

As an example, the first recess configuration 1362 may comprise a first plurality of cylindrical recesses, wherein each of the first plurality of cylindrical recesses is characterized by a first depth and a first diameter. As shown in FIG. 13B, the first recess configuration 1362 is located near an outer region of the plasma surface 1360.

The first diameter may be an integer number of quarter wavelengths (n $\lambda/4$, where n is an integer greater than zero), or an integer number of half wavelengths (m $\lambda/2$, where m is an integer greater than zero), or a non-integral fraction of the effective wavelength. Additionally, a first difference between the plate thickness and the first depth may be an integer number of quarter wavelengths (n $\lambda/4$, where n is an integer greater than zero), or an integer number of half wavelengths (m $\lambda/2$, where m is an integer greater than zero), or a non-integral fraction of the effective wavelength. For instance, the first diameter may be about half the effective wavelength ($\lambda/2$), and the first difference between the plate thickness and the first depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the first diameter may range from about 25 mm to about 35 mm, and the first difference between the plate thickness and the first depth may range from about 10 mm to about 35 mm. Alternatively yet, the first diameter may range from about 30 mm to about 35 mm, and the first difference may range from about 10 mm to about 20 mm. Alternatively yet, the first diameter and/or first depth may be a fraction of the plate thickness.

In the first recess configuration 1362, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma surface 1360. For example, the surface radius may range from about 1 mm to about 3 mm.

As another example, the second recess configuration 1364 may comprise a second plurality of cylindrical recesses, each of the second plurality of cylindrical recesses being characterized by a second depth and a second diameter. As shown in FIG. 13B, the second recess configuration 1364 is located near an inner region of the plasma surface 1360.

The second diameter may be an integer number of quarter wavelengths (n$\lambda/4$, where n is an integer greater than zero), or an integer number of half wavelengths (m$\lambda/2$, where m is an integer greater than zero), or a non-integral fraction of the effective wavelength. Additionally, a second difference between the plate thickness and the second depth may be an integer number of quarter wavelengths (n$\lambda/4$, where n is an integer greater than zero), or an integer number of half wavelengths (m$\lambda/2$, where m is an integer greater than zero), or a non-integral fraction of the effective wavelength. For instance, the second diameter may be about half the effective wavelength ($\lambda/2$), and the second difference between the plate thickness and the second depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the second diameter may range from about 25 mm to about 35 mm, and the second difference between the plate thickness and the second depth may range from about 10 mm to about 35 mm. Alternatively yet, the second diameter may range from about 30 mm to about 35 mm, and the second difference may range from about 10 mm to about 20 mm. Alternatively yet, the second diameter and/or second depth may be a fraction of the plate thickness.

In the second recess configuration 1364, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma surface 1360. For example, the surface radius may range from about 1 mm to about 3 mm.

Referring again to FIG. 13B, a bottom view of the EM wave launcher 1332 depicted in FIG. 13A is provided. The plurality of slots 1348 in slot antenna 1346 are illustrated as if one can see through resonator plate 1350 to the slot antenna 1346. As shown in FIG. 13B, the plurality of slots 1348 may be arranged in pairs, wherein each of the pair of slots comprises a first slot oriented orthogonal to a second slot. However, the orientation of slots in the plurality of slots 1348 may be arbitrary. For example, the orientation of slots in the plurality of slots 1348 may be according to a pre-determined pattern for plasma uniformity and/or plasma stability.

The first recess configuration 1362 is substantially aligned with a first arrangement of slots in the plurality of slots 1348. Therein, at least one recess of the first recess configuration 1362 may be aligned, partially aligned, or not aligned with one or more of the plurality of slots 1348. The second recess configuration 1364 is either partly aligned with a second arrangement of slots in the plurality of slots 1348 or not aligned with the second arrangement of slots in the plurality of slots 1348. As shown in FIG. 13B, the second recess configuration 1364 is not aligned with the second arrangement of slots in the plurality of slots 1348.

As a consequence, the arrangement of the first and second recess configurations 1362, 1364 and their alignment with one or more of the plurality of slots 1348 may be optimized to control and/or improve plasma uniformity and/or stability. Additional details regarding the design of the plasma surface 1360 and the EM wave launcher 1332 can be found in pending U.S. Patent Application Publication Serial No. 2011/0057562, entitled "Stable surface wave plasma source", and filed on Sep. 8, 2009; the content of which is herein incorporated by reference in its entirety.

Figure 14:
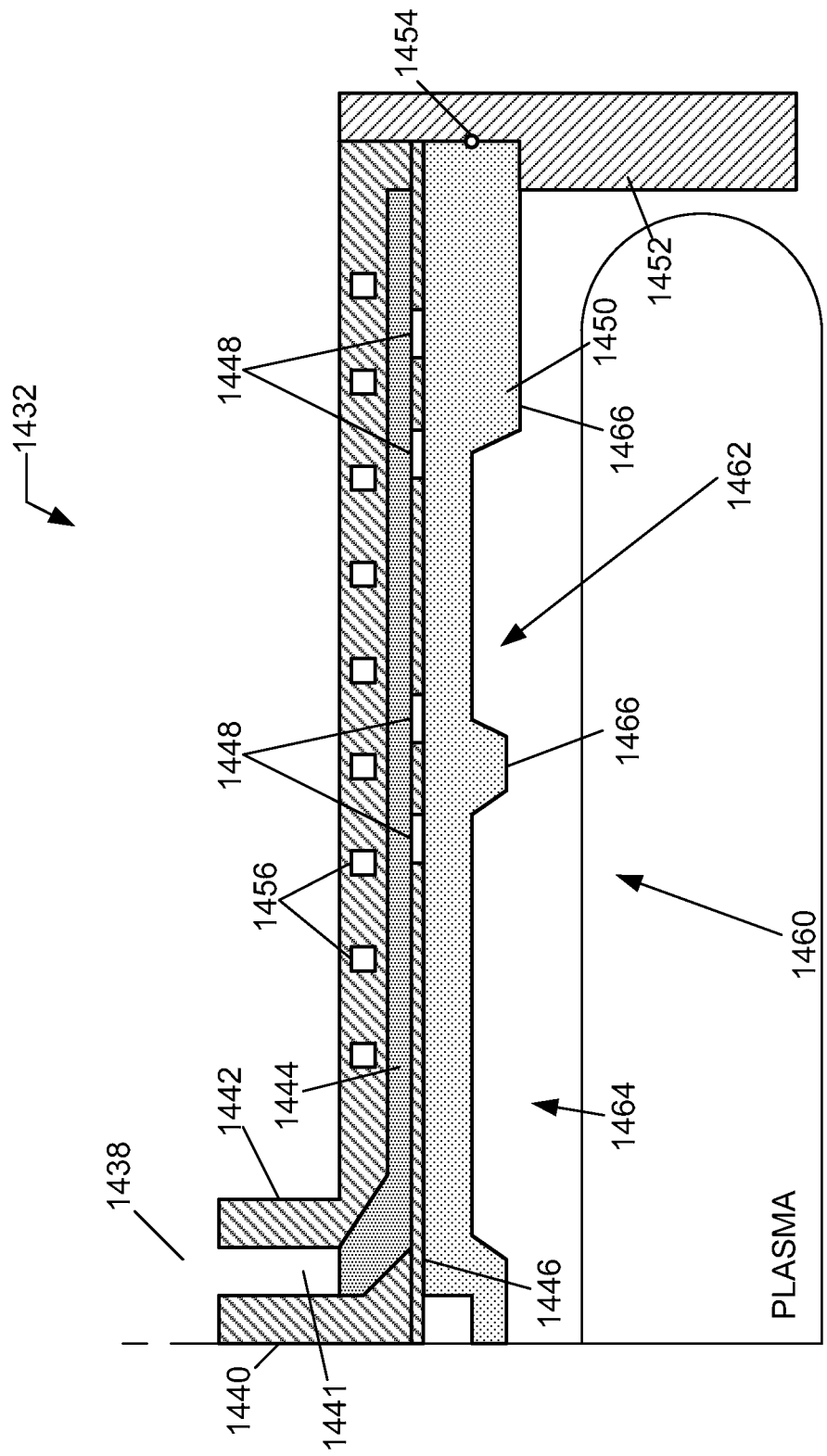
FIG. 14 depicts a cross-sectional view of a plasma source in accordance with yet another embodiment.

Referring now to FIG. 14, a schematic cross-sectional view of an EM wave launcher 1432 is provided according to another embodiment. The EM wave launcher 1432 comprises the coaxial feed 1438 having an inner conductor 1440, an outer conductor 1442, and insulator 1441, such as an air gap, and a slot antenna 1446 having a plurality of slots 1448 coupled between the inner conductor 1440 and the outer conductor 1442 as shown in FIG. 14. The plurality of slots 1448 permits the coupling of EM energy from a first region above the slot antenna 1446 to a second region below the slot antenna 1446, wherein plasma is formed adjacent a plasma surface 1460 on the EM wave launcher 1432. The EM wave launcher 1432 may further comprise a slow wave plate 1444, and a resonator plate 1450.

The number, geometry, size, and distribution of the slots 1448 are all factors that can contribute to the spatial uniformity of the plasma formed in the plasma processing region 545 (see FIG. 11). Thus, the design of the slot antenna 1446 may be used to control the spatial uniformity of the plasma in the plasma processing region 545 (see FIG. 11).

As shown in FIG. 14, the EM wave launcher 1432 may comprise a fluid channel 1456 that is configured to flow a temperature control fluid for temperature control of the EM wave launcher 1432. Although not shown, a gas distribution system, such as the gas distribution system (540) of FIG. 11, may be connected to the EM wave launcher 1432 and/or the chamber wall 1452 for introducing a process gas into the process chamber.

Referring still to FIG. 14, the EM wave launcher 1432 may be coupled to an upper chamber portion of a plasma processing system, wherein a vacuum seal can be formed between an upper chamber wall 1452 and the EM wave launcher 1432 using a sealing device 1454. The sealing device 1454 can include an elastomer O-ring; however, other known sealing mechanisms may be used.

In general, the inner conductor 1440 and the outer conductor 1442 of the coaxial feed 1438 comprise a conductive material, such as a metal, while the slow wave plate 1444 and the resonator plate 1450 comprise a dielectric material. In the latter, the slow wave plate 1444 and the resonator plate 1450 preferably comprise the same material; however, different materials may be used. The material selected for fabrication of the slow wave plate 1444 is chosen to reduce the wavelength of the propagating electromagnetic (EM) wave relative to the corresponding free-space wavelength, and the dimensions of the slow wave plate 1444 and the resonator plate 1450 are chosen to ensure the formation of a standing wave effective for radiating EM energy into the plasma processing region 545 (see FIG. 11).

The slow wave plate 1444 and the resonator plate 1450 can be fabricated from a dielectric material, including silicon-containing materials such as quartz (silicon dioxide), or a high dielectric constant (high-k) materials. For example, the high-k material may possess a dielectric constant greater than a value of 4. In particular, when the plasma processing system is utilized for etch process applications, quartz is often chosen for compatibility with the etch process.

For example, the high-k material can include intrinsic crystal silicon, alumina ceramic, aluminum nitride, and sapphire. However, other high-k materials may be used. Moreover, a particular high-k material may be selected in accordance with the parameters of a particular process. For example, when the resonator plate 1450 is fabricated from intrinsic crystal silicon, the plasma frequency exceeds 2.45 GHz at a temperature of 45 degrees C. Therefore, intrinsic crystal silicon is appropriate for low temperature processes (i.e., less than 45 degrees C.). For higher temperature processes, the resonator plate 1450 can be fabricated from alumina ($Al_2O_3$), or sapphire.

Plasma uniformity and plasma stability may remain as challenges for the practical implementation of a SWP source as described above. In the latter, the standing wave at the resonator plate-plasma interface, i.e., at the plasma surface 1460, may be prone to mode jumps as plasma parameters shift.

As shown in FIG. 14, the EM wave launcher 1432 may be fabricated with a first recess configuration 1462 formed in the plasma surface 1460 and optionally a second recess configuration 1464 formed in the plasma surface 1460 according to one embodiment.

The first recess configuration 1462 may comprise a first channel recess. For example, the first channel recess in the first recess configuration 1462 may include a cross-section that has a frusto-conical geometry. However, other geometries may be used, e.g., a spherical geometry, an aspherical geometry, a rectangular geometry, a pyramidal geometry, or any arbitrary shape. The first recess distribution 1462 may comprise a channel recess characterized by a first size (e.g., latitudinal dimension (or width), and/or longitudinal dimension (or depth)).

The second recess configuration 1464 may comprise a second channel recess. For example, the second channel recess in the second recess configuration 1464 may include a cross-section that has a frusto-conical geometry. However, other geometries may be used, e.g., a spherical geometry, an aspherical geometry, a rectangular geometry, a pyramidal geometry, or any arbitrary shape. The second recess distribution 1464 may comprise a channel recess characterized by a second size (e.g., latitudinal dimension (or width), and/or longitudinal dimension (or depth)). The first size of the first channel recess in the first recess configuration 1462 may or may not be the same as the second size of the second channel recess in the second recess configuration 1464. For instance, the second size may be larger than the first size.

As shown in FIG. 14, the resonator plate 1450 comprises a dielectric plate having a plate diameter and a plate thickness. Therein, the plasma surface 1460 on resonator plate 1450 comprises a planar surface 1466 within which the first recess configuration 1462 and the second recess configuration 1464 are formed. Alternatively, the resonator plate 1450 comprises a non-planar geometry or an arbitrary geometry. Therein, the plasma surface 1460 may comprise a non-planar surface within which the first recess configuration and the second recess configuration are formed (not shown). For example, the non-planar surface may be concave, or convex, or a combination thereof.

The arrangement of the first and second recess configurations (1462, 1464) and their alignment with one or more of the plurality of slots 1448 may be optimized to control and/or improve plasma uniformity and/or stability. Additional details regarding the design of the plasma surface 1460 and the EM wave launcher 1432 can be found in pending U.S. patent application Ser. No. 10/570,631, entitled "Plasma processing equipment", filed on Dec. 19, 2006, and published as U.S. Patent Application Publication No. 2007/0113788A1; the content of which is herein incorporated by reference in its entirety.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for etching a metal-containing layer on a substrate, comprising:
   disposing a substrate having an aluminum-containing layer formed thereon in a plasma processing system;
   forming plasma from a process composition containing a halogen element;
   exposing said substrate to said plasma to etch said aluminum-containing layer while simultaneously exposing said substrate to an oxygen-containing environment to oxidize a surface of said aluminum-containing layer and control an etch rate of said aluminum-containing layer.

2. The method of claim 1, wherein said aluminum-containing layer is aluminum or aluminum oxide ($AlO_x$).

3. The method of claim 1, wherein said process composition contains a fluorine-containing gas, a chlorine-containing gas, a bromine-containing gas, a hydrogen halide gas, or a halomethane gas, or any combination of two or more thereof.

4. The method of claim 1, wherein said process composition contains Br and one or more elements selected from a group consisting of C, H, F, and Cl.

5. The method of claim 1, wherein said process composition contains C and one or more elements selected from a group consisting of H, F, Cl, Br, and I.

6. The method of claim 1, wherein said process composition further contains an additive gas having a chemical formula $C_xH_yR_z$, where R is a halogen element, x and y are equal to unity or greater, and z is equal to zero or greater.

7. The method of claim 1, wherein said process composition contains HBr and an additive gas having a chemical formula $C_xH_yF_z$, where x, y and z are equal to unity or greater.

8. The method of claim 1, wherein said process composition contains HBr, $CH_3F$, and optionally Ar.

9. The method of claim 1, wherein said oxygen-containing environment contains O, $O_2$, $O_3$, CO, $CO_2$, NO, $N_2O$, or $NO_2$, or any combination of two or more thereof.

10. The method of claim 1, wherein said oxygen-containing environment contains an oxygen-containing plasma.

11. The method of claim 1, further comprising:
applying an electrical bias to said substrate by coupling radio frequency (RF) power to a substrate holder upon which said substrate rests; and
achieving a target etch selectivity between said aluminum-containing layer and a layer containing Si and O formed on said substrate by adjusting an RF power level for said electrical bias.

12. The method of claim 1, wherein said forming plasma comprises coupling electromagnetic (EM) energy at a microwave frequency in a desired EM wave mode to said plasma by generating a surface wave on a plasma surface of an EM wave launcher adjacent said plasma, said EM wave launcher comprises a slot antenna having a plurality of slots formed there through configured to couple said EM energy from a first region above said slot antenna to a second region below said slot antenna.

13. A method for etching a metal-containing layer on a substrate, comprising:
disposing a substrate having an aluminum-containing layer formed thereon in a plasma processing system;
etching said aluminum-containing layer in a two-step etching process, comprising:
forming first plasma from a first process composition containing HBr and an additive gas having a chemical formula $C_xH_yR_z$, wherein R is a halogen element, x and y are equal to unity or greater, and z is equal to zero or greater, and exposing said substrate to said first plasma to etch said aluminum-containing layer; and
thereafter, forming second plasma from a second process composition containing HBr, and exposing said substrate to said second plasma to further etch said aluminum-containing layer.

14. The method of claim 13, wherein said aluminum-containing layer includes a bulk aluminum layer with an aluminum oxide ($AlO_x$) surface layer, and wherein said first plasma etches the aluminum oxide surface layer and the second plasma etches said bulk aluminum layer.

15. The method of claim 14, wherein said additive gas is $CH_3F$.

* * * * *